(12) United States Patent
Feger et al.

(10) Patent No.: US 8,178,153 B2
(45) Date of Patent: May 15, 2012

(54) HEAT TRANSFER CONTROL STRUCTURES USING THERMAL PHONON SPECTRAL OVERLAP

(75) Inventors: Claudius Feger, Poughkeepsie, NY (US); Maurice McGlashan-Powell, Mount Vernon, NY (US); Ijeoma M. Nnebe, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 1142 days.

(21) Appl. No.: 11/395,857

(22) Filed: Mar. 31, 2006

(65) Prior Publication Data

US 2007/0230135 A1    Oct. 4, 2007

(51) Int. Cl.
*B05D 5/12* (2006.01)
*H05K 7/20* (2006.01)

(52) U.S. Cl. .......................... 427/58; 361/717

(58) Field of Classification Search ............... 427/97.1, 427/58
See application file for complete search history.

(56) References Cited

U.S. PATENT DOCUMENTS

| | | | |
|---|---|---|---|
| 3,235,397 A | | 4/1962 | Milendorfer |
| 5,621,616 A | * | 4/1997 | Owens et al. ................. 361/704 |
| 2003/0109121 A1 | * | 6/2003 | Rotondaro ................... 438/592 |
| 2005/0189883 A1 | * | 9/2005 | Suh et al. .................. 315/169.3 |

OTHER PUBLICATIONS http://hyperphysics.phy-astr.gsu.edu/Hbase/Tables/thrcn2.html Data from Kittel, Introduction to Solid State Physic, 7th Ed.*
http://environmentalchemistry.com/yogi/periodic/electrical.html. Periodic table of elements sorted by electrical conductivity. 2007.*
www.oxmat.co.uk. Silicon Dioxide.*
Kittel, Introduction to Solid State Physics, 7th ed.*
www.ioffe.ru/sva/nsm/semicond/sige/basic.html.*
Ju, "Phonon heat transport in silicon nanostructures" 2005.*
www.oxmat.co.uk Silicon Dioxide (Mar. 2005).*
Kittel, Introduction to Solid State Physics, 7th ed (Nov. 2004).*
www.ioffe.ru/sva/nsm/semicond/sige/basic.html (Oct. 2007).*
Swartz, et al., "Thermal boundary resistance", Reviews of Modern Physics, vol. 61, No. 3, Jul. 1989, pp. 605-668.
Stevens, et al., "Thermal Boundary Resistance of Thin Metal Films and Thermally Conductive Dielectric Materials", Proc. IMECE'03, Nov. 15-21, 2003, pp. 329-345.
Stevens, et al., "Molecular-Dynamics Study of Thermal Boundary Resistance: Evidence of Strong Inelastic Scattering Transport Channels", Proc. IMECE '04, Nov. 13-20, 2004, pp. 1-10.

(Continued)

*Primary Examiner* — James Lin
*Assistant Examiner* — Austin Murata
(74) *Attorney, Agent, or Firm* — Scully Scott Murphy & Presser, P.C.; Daniel P. Morris, Esq.

(57) ABSTRACT

A heat transfer control structure and a method for fabrication thereof includes at least one heat transfer control layer interposed between and contacting a heat source material and a heat sink material. The at least one heat transfer control layer is selected predicated upon thermal phonon spectra overlap between the heat source material, the at least one heat transfer control layer and the heat sink material. The at least one heat transfer control layer may enhance or retard heat transfer between the heat source material and the heat sink material. The at least one heat transfer control layer may be selected based upon a value of a thermal phonon correlating parameter such as a Debye temperature, a density or a lattice constant.

6 Claims, 6 Drawing Sheets

OTHER PUBLICATIONS

Prasher, et al., "A Scattering-Mediated Acoustic Mismatch Model for the Prediction of Thermal Boundary Resisatance", J. Heat Transfer, vol. 123, Feb. 2001, pp. 105-112.

Cahill, "Thermal conductivity measurement from 30 to 750 K: the 3?method", Rev. Sci. Instrum. 61(2), Feb. 1990, pp. 802-808.

Jagannadham, et al., "Thermal resistance of interface in AlN-diamond thin film composites", Journal of Applied Physics, vol. 91, No. 3, Feb. 1, 2002, pp. 1224-1235.

Hwang, et al., "Thin Oxide for Submicron Devices: An Overview and Status Report", Chinese Journal of Physics, vol. 30, No. 6, Dec. 1992, pp. 899-913.

Brauer, et al., "Characterization of the SiO2/Si; interface by positron annihilation spectroscopy", Physical Review B 66, (2002), pp. 195331-1-195331-10.

Huxtable, et al., "Thermal conductivity of Si/SiGe and SiGe/SiGe superlattices", Applied Physics Letters, vol. 80, No. 10, Mar. 11, 2002, pp. 1737-1739.

* cited by examiner

| SURFACE | LAYER [n] | MATERIAL | ΔθD (K) | θD (K) | R (g/cc) | a (nm) | v (m/s) | PREDICTED Rb (m2-K/W) |
|---|---|---|---|---|---|---|---|---|
| SILICON | 0 | | | 645 | 2.33 | 0.543 | 5322 | |
| | 1 | TITANIUM | 225 | 420 | 4.54 | 0.295 | 3097 | 1.3x10-9 |
| | 2 | COPPER | 77 | 343 | 3.61 | 0.361 | 2256 | 0.8x10-9 |
| | 3 | HAFNIUM | 91 | 252 | 13.31 | 0.320 | 1840 | 1.1x10-9 |
| GOLD | 4 | | 87 | 165 | 19.30 | 0.129 | 1201 | 2.4x10-9 |
| | | | | | | | | Σ= 5.6x10-9 |
| SILICON | 0 | | | 645 | 2.33 | 0.543 | 5322 | |
| | 1 | TITANIUM | 225 | 420 | 4.54 | 0.295 | 3097 | 1.3x10-9 |
| GOLD | 2 | | 255 | 165 | 19.30 | 0.129 | 1201 | 7.3x10-9 |
| | | | | | | | | Σ= 8.6x10-9 |
| SILICON | 0 | | | 645 | 2.33 | 0.543 | 5322 | |
| GOLD | 1 | | 480 | 165 | 19.30 | 0.129 | 1201 | 2.2x10-8 |

HEAT TRANSFER CONTROL STRUCTURES USING THERMAL PHONON SPECTRAL OVERLAP

BACKGROUND

1. Field of the Invention

The invention relates generally to heat transfer control within nanostructures and nanodevices. More specifically, the invention relates to efficient heat transfer control within nanostructures and nanodevices.

2. Description of the Related Art

Ultra-thin films (i.e., films having sub-micron thickness dimensions) are used extensively in modern technology. In particular, ultra thin films are used in technologies such as, but not limited to: microelectromechanical system (MEMS), microelectronic, and optoelectronic technologies. The foregoing technologies have continuing demands for structure and device miniaturization.

For many of these technologies, significant heat is generated during device operation and the dissipation of this heat is critical to maintain operational efficiency and proper device performance. In other technologies, heat confinement is desired to achieve a certain objective, such as, for example, a structural phase change in a phase-change memory cell.

The growing investment in nanotechnology assures that nanoscale dimensions will be the prevalent dimensions for future devices. Similarly, since the downward scaling of device dimensions within several technologies is certain to continue, and demands for enhanced device performance are certain also to continue, enhanced and efficient heat transfer control within nanostructures and nanodevices clearly merits consideration.

SUMMARY OF THE INVENTION

The invention is predicated upon the observation that heat transfer in nanoscale films is not adequately described by the traditional macroscopic heat transport theories that rely upon continuum physics. Instead, for nanoscale films, the molecular origins for heat transfer must be considered. For a crystalline material, heat is propagated through the material through quantized vibrations of the crystal lattice, termed phonons. These phonons propagate over a certain distance, defined as the mean free path, before they are scattered due to collisions with electrons, other phonons, or defects in the lattice. A significant amount of phonon scattering also occurs at a boundary or interface between two materials, resulting in some resistance to heat transfer at the interface. This is referred to as thermal boundary resistance (see, e.g., Swartz et al. "Thermal Boundary Resistance," Rev. Mod. Phys., Vol. 61(3), July 1989, pp. 605-68). When a material thickness approaches a phonon mean free path, the thermal boundary resistance becomes comparable to the bulk resistance of the material. Therefore, for devices based on ultra-thin films with thickness on the order of a phonon mean free path (or less than that thickness), thermal boundary resistance must be addressed in heat transfer control (i.e., thermal management) structures and solutions of those devices.

Phonon transfer across interfaces can be characterized by a transmission or reflection coefficient in an analogous manner to the transmission or reflection of photons (light) from one medium to another. Effectively, thermal boundary resistance is proportional to a reflection coefficient of phonons at an interface or conversely, inversely proportional to a phonon transmission coefficient at an interface. Thereby, heat transfer in ultra-thin films for which thermal boundary resistance is dominant is by a similar argument dependent on the phonon transmission coefficient at the interface, as the heat transfer is dependent on phonon transmission across the boundary. Controlling the transmission coefficient will consequently control heat transfer across the boundary.

In an optical analogue, a photon transmission coefficient can be increased or decreased by a proper choice of coating materials (based on the indices of refraction) of appropriate thicknesses. This principle is illustrated in optical anti-reflection coatings (see, e.g., Milendorfer, U.S. Pat. No. 3,235, 397).

More specifically, the invention entails the use of at least one engineered nanofilm heat transfer control layer used to control a phonon transmission coefficient at an interface between a heat source material and a heat sink material. The terms "heat source material" and "heat sink material" are intended to describe originally interfacing materials with a temperature gradient between them. Specifically, the at least one heat transfer control layer is designed to systematically control a phonon spectral mismatch between interfaces thereby controlling the phonon transmission coefficient and correspondingly controlling the overall thermal boundary resistance and heat transfer in the system. The at least one engineered heat transfer control layer can be used to control heat transfer between crystalline or semi-crystalline conductor, semiconductor and dielectric heat source materials and heat sink materials when used in ultra-thin film technologies.

The phonon transmission coefficient or thermal boundary resistance between various material interfaces may be determined using experimental techniques (see, e.g., Stevens et al., "Thermal Boundary Resistance of Thin Metal Films and Thermally Conductive Dielectric Materials," Proc. IMECE '03, pp. 329-45) or through relevant and accurate theoretical modeling (see, e.g.: (1) Stevens et al. "Molecular-Dynamics Study of Thermal Boundary Resistance: Evidence of Strong Inelastic Scattering Transport Channels," Proc. IMECE '04, pp. 1-10; and (2) Prasher et al., "A Scattering Mediated Acoustic Mismatch Model for the Prediction of Thermal Boundary Resistance," J. Heat Transfer, Vol. 123, February 2001, 105-12). Further, particular heat source material, heat sink material and heat transfer control material parameters may be found to directly influence phonon transmission across an interfacial boundary.

For example, one finds, using a pertinent existing theory describing thermal phonon transmission across an interfacial boundary (i.e., the Scattering-Mediated Acoustic Mismatch Model (SMAMM) model that correlates near-interface scattering with interface scattering and boundary resistance) (see, e.g., Prasher, above), that a Debye temperature difference between two interfacing materials has a significant influence on a thermal boundary resistance at that interface. This result has also been observed in molecular dynamics simulations and in experimental measurements (see, e.g., Stevens references, above).

Therefore, in one preferred embodiment of the invention, one can control the thermal boundary resistance between a heat source material and a heat sink material having a large Debye temperature difference to enhance heat transfer between the heat source material and the heat sink material. The enhanced heat transfer may be effected by forming at least one intervening heat transfer control layer between the heat source material and the heat sink material to provide a series of graded (i.e., upward or downward) Debye temperatures of the heat source material, the at least one heat transfer control layer and the heat sink material, such that the Debye temperature difference between interfacing materials at each resulting interface is smaller than between the heat source material and the heat sink material alone.

Conversely, in another preferred embodiment of the invention, one can control the thermal boundary resistance between a heat source material and a heat sink material of small Debye temperature difference to provide a retarded heat transfer between the heat source material and the heat sink material. The retarded heat transfer is effected by using at least one intervening heat transfer control layer such that the Debye temperature differences at newly formed interfaces therewith is larger than Debye temperature difference between the heat source material and the heat sink material alone.

It is important to note that in certain instances other material properties, including but not limited to the density and the lattice spacing (of the heat source material, the at least one heat transfer control layer and at the heat sink material) may significantly affect the phonon transmission across pertinent interfaces.

Therefore, the invention is intended to include a heat transfer structure comprising a heat source material, a heat sink material and at least one heat transfer control layer interposed between the heat source material and the heat sink material. Material properties including but not limited to Debye temperature, density, and lattice spacing, are: (1) evaluated for the heat source material and heat sink material; and (2) used to choose appropriate heat transfer control layer materials, to effectively control the phonon transmission (i.e., and resulting heat transfer) to a level not otherwise intrinsically accessible between the heat source material and the heat sink material.

Control of thermal boundary resistance for enhanced heat transfer using at least one appropriate heat transfer control layer can significantly increase cooling efficiencies and thus enhance performance in very large scale integration complementary metal oxide semiconductor (VLSI-CMOS) devices, microelectromechanical system (MEMS) devices and optoelectronic devices. Control of thermal boundary resistance for retarded heat transfer with at least one appropriate heat transfer control layer may serve useful in structures where heat containment is required for proper device operation, such as in phase-change memory cell structures or in reaction cell structures within microreactors.

The invention is claimed within the context of heat transfer control structures and methods for fabricating heat transfer control structures.

A heat transfer control structure in accordance with the invention includes at least one heat transfer control layer interposed between and contacting a heat source material and a heat sink material. The at least one heat transfer control layer is selected to control heat transfer from the heat source material to the heat sink material predicated-upon a degree of thermal phonon spectra match between the heat source material, the at least one heat transfer control layer and the heat sink material.

Another heat transfer control structure in accordance with the invention includes a plurality of heat transfer control layers interposed between and contacting a heat source material and a heat sink material. The heat source material, the plurality of heat transfer control layers and the heat sink material have a series of values of a thermal phonon spectra correlating parameter to effect thermal phonon based heat transfer control between the heat source material and the heat sink material.

A method for fabricating a heat transfer control structure in accordance with the invention includes forming at least one heat transfer control layer upon one of a heat source material and a heat sink material. The method also includes forming the other of the heat source material and the heat sink material upon the at least one heat transfer control layer. The heat transfer control layer is selected predicated upon a degree of thermal phonon spectra match between the heat source material, the at least one heat transfer control layer and the heat sink material.

Finally, a method for designing a heat transfer control structure includes determining a Debye temperature difference between a heat source material and a heat sink material for which an arbitrarily determined thermal boundary resistance condition is intrinsically not accessible. The method also includes estimating a number of heat transfer control layers having a corresponding series of Debye temperature ranges needed to achieve the arbitrarily determined thermal boundary resistance condition based upon the Debye temperature difference between the heat source material and the heat sink material. The method also includes identifying a number of candidate heat transfer control materials within each of the Debye temperature ranges needed to achieve the arbitrarily determined thermal boundary resistance condition. The method further includes determining a series of candidate thermal boundary resistances for a series of candidate interfaces comprising each of the candidate heat transfer control materials. Finally, the method also includes selecting the heat transfer control materials for the number of heat transfer control layers to achieve the arbitrarily determined thermal boundary resistance condition by evaluating the series of candidate thermal boundary resistances.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention, which comprises heat transfer control structures and methods for fabrication thereof, is described in further detail below by reference to the drawings described above. The drawings are intended for illustrative purposes, and as such are not necessarily drawn to scale.

Figure 1:
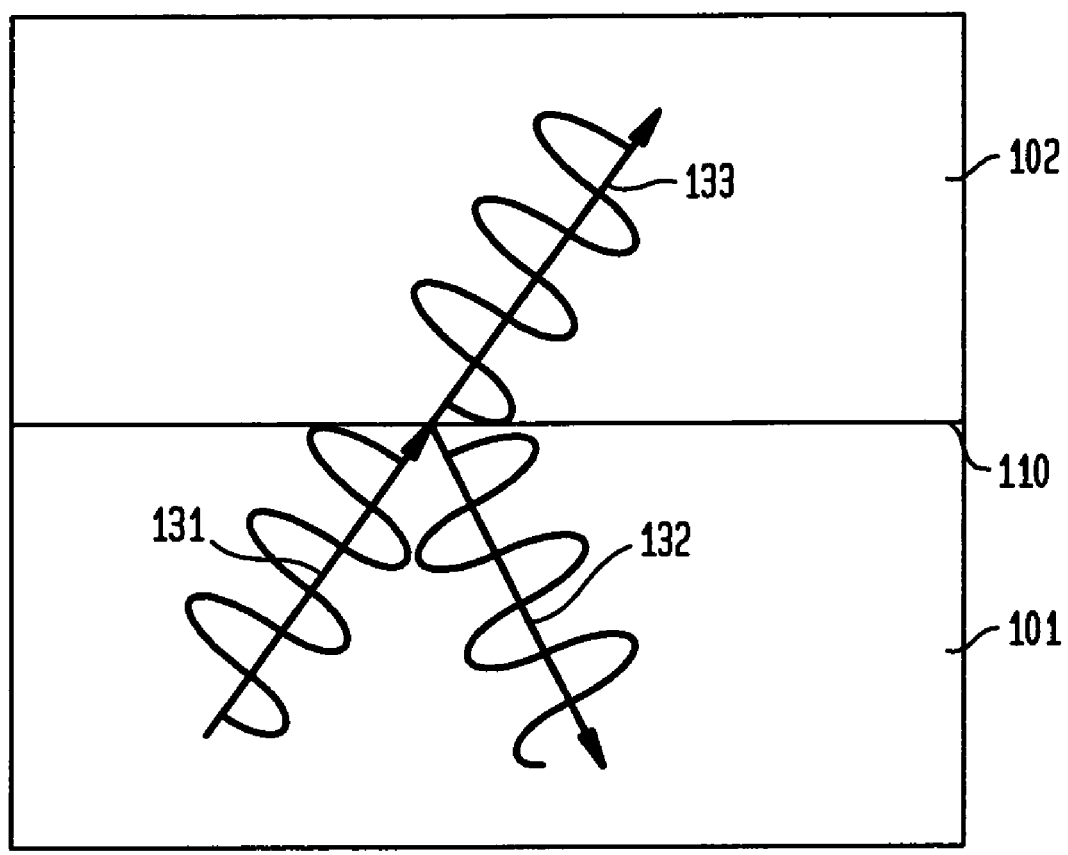
FIG. 1 illustrates the concept of phonon transmission and reflection at an interface between materials.

FIG. 1 shows a diagram that illustrates the concept of phonon transmission and reflection at an interface between two materials. An incident phonon wavepacket 131 reaches an interface 110 between a first material 101 and a second material 102. At the interface 110 between the first material 101 and the second material 102, the incident phonon wavepacket 131 may be reflected as a reflected phonon wavepacket 132, transmitted as a transmitted phonon wavepacket 133, or partially reflected as the reflected phonon wavepacket 132 and partially transmitted as the transmitted phonon wavepacket 133. A phonon transmission coefficient for heat transfer (i.e., phonon transmission) between the first material 101 and the second material 102 is dependent on a phonon spectral match between the first material 101 and the second material 102. Such a phonon spectral match will be illustrated in greater detail below (see, e.g., FIG. 3a, FIG. 3b and related disclosure).

Figure 2A:
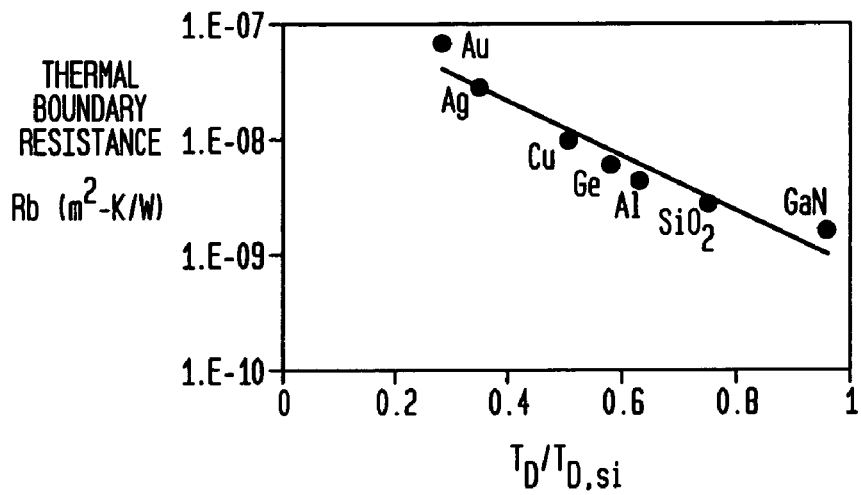
FIG. 2a, FIG. 2b and FIG. 2c show a series of graphs illustrating a dependence of a theoretically calculated thermal boundary resistance between silicon and each of a group of other materials as a function of the material parameters: (a) Debye temperature (FIG. 2a); (b) density (FIG. 2b); and (c) lattice spacing (FIG. 2c).
Figure 2B:
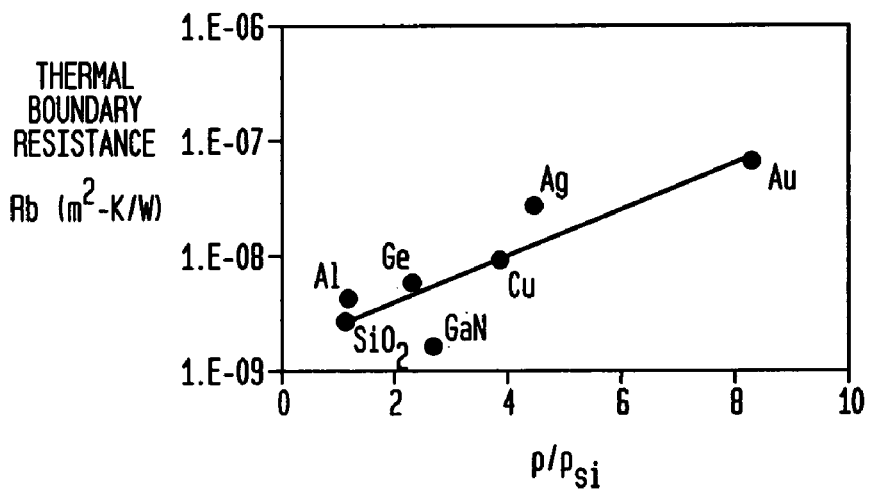
Figure 2C:
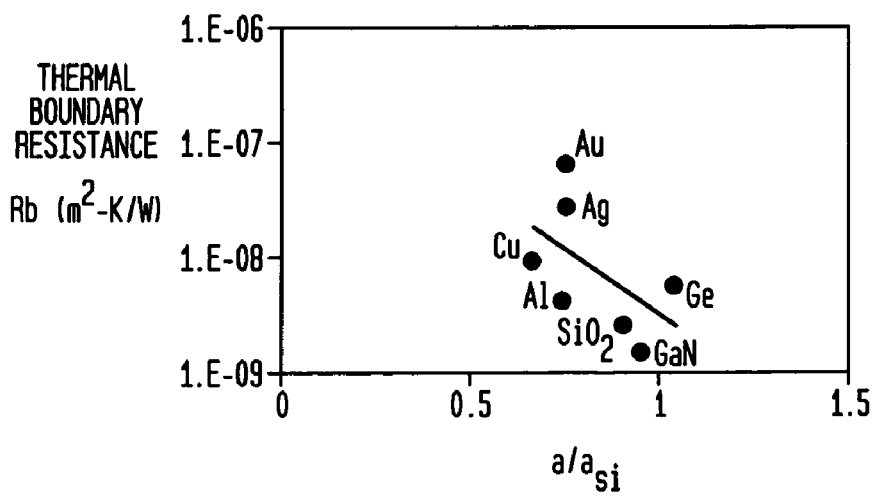

FIG. 2a, FIG. 2b and FIG. 2c shows a series of graphs of thermal boundary resistance $R_b$ as a function of various materials parameters for thin film materials. Within FIG. 2a, FIG. 2b and FIG. 2c, values of the materials parameters for the thin film materials are normalized to values of the same parameters for silicon. The series of graphs is intended to show dependencies of theoretically calculated (or experimentally determined) thermal boundary resistance values between silicon and the thin film material layers. The thermal boundary resistance $R_b$ may be calculated using the SMAMM model referenced above (see, e.g., Prasher et at., as cited above). Alternatively, thermal boundary resistances may be readily experimentally determined. A dependence of thermal boundary resistance upon the investigated parameters of Debye temperature $T_D$ ratio (FIG. 2a), density $\rho$ ratio (FIG. 2b), and lattice spacing a ratio (FIG. 2c) may be determined by using an appropriate number of heat transfer test structures. A most significant dependence of thermal boundary resistance was found with respect to a Debye temperature ratio between interfacing materials (i.e., FIG. 2a). A density mismatch between interfacing materials also showed a strong dependence with respect to a thermal boundary resistance (i.e., FIG. 2b). A lattice mismatch between interfacing materials did not show an obvious correlation with a thermal boundary resistance between the interfacing materials (i.e., FIG. 2c).

As indicated above, an observed strong theoretically expected correlation between thermal boundary resistance $R_b$ and Debye temperature $T_D$ mirrors findings obtained from molecular dynamics simulations and recent transient thermoreflectance experiments (see, e.g., Swartz, as cited above). The Debye temperature of a crystalline material is the temperature of a crystalline material's highest normal mode of vibration and is proportional to the characteristic vibration frequency of the crystalline material. Mismatches in Debye temperature give an indication of the mismatch in phonon spectra between two materials, and therefore significantly impact phonon coupling (and heat transfer) from one material to an interfacing material.

Figure 3A:
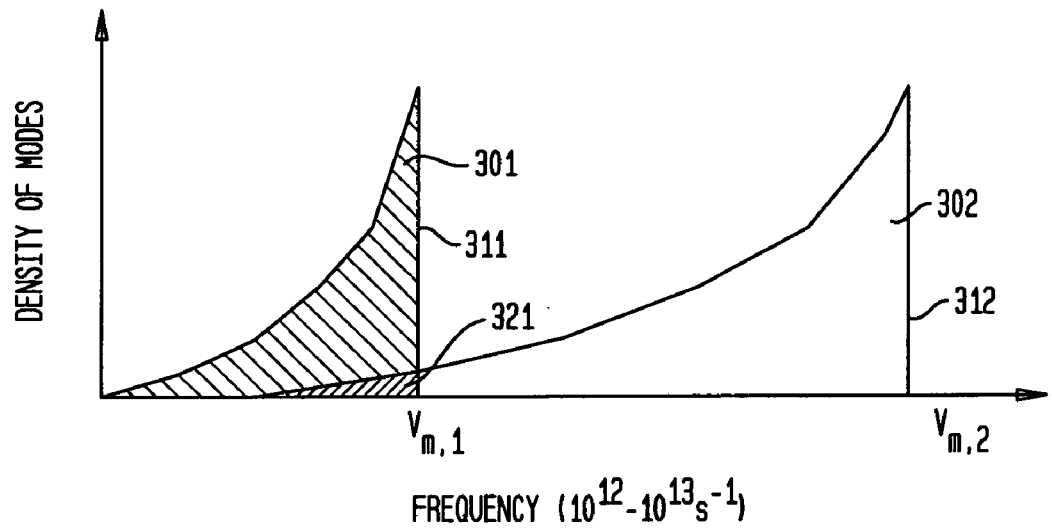
FIG. 3a and FIG. 3b show a pair of graphs illustrating variations of phonon spectral overlap between two interfacing materials within the context of Debye temperature differences between the two interfacing materials.
Figure 3B:
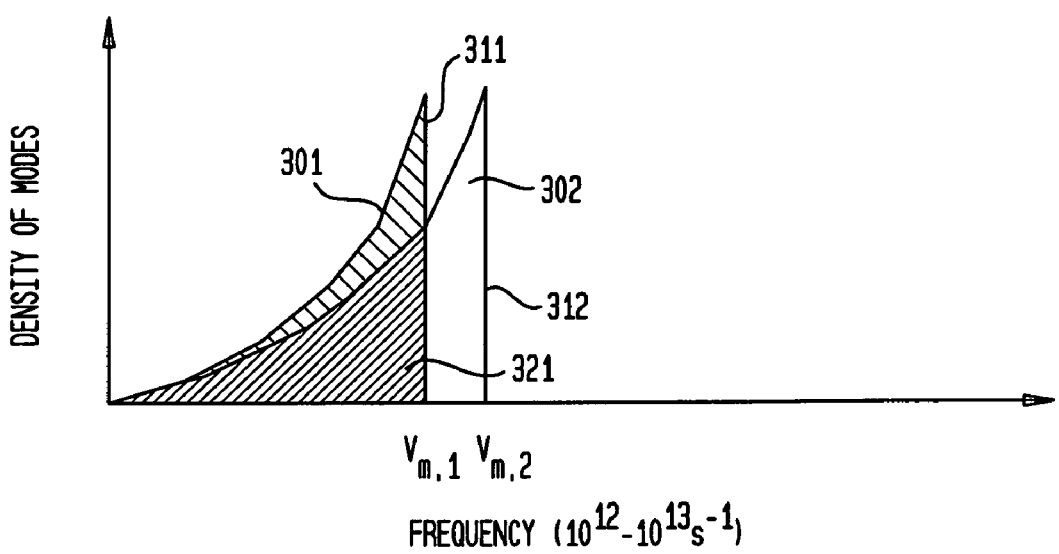

FIG. 3a and FIG. 3b show a pair of graphs of density of modes versus vibrational frequency that illustrate how a Debye temperature is coupled within the context of a phonon spectral mismatch. For example, FIG. 3a illustrates a heat sink material 301 interfaced with a heat source material 302. Each of the heat sink material 301 and the heat source material 302 has a corresponding characteristic maximum phonon normal vibrational frequency $\upsilon_{m,1}$ 311 or $\upsilon_{m,2}$ 312. Due to their largely different phonon normal vibrational frequencies, a phonon spectral match 321 between the heat sink material 301 and the heat source material 302 is small, since they share very few identical vibrational frequency modes. Therefore, for phonon coupling to occur, many of the high frequency vibrations of heat source material 302 would have to be altered through inelastic processes for additional phonon transmission. The Debye temperature is defined by the equation: $T_D = (h\upsilon_m)/k_B$ (where h equals Planck's constant and $k_B$ equals Boltzmann's constant). Therefore, largely different Debye temperatures reflect largely different phonon vibration frequencies and a poor phonon spectral match.

In contrast, FIG. 3b shows the heat sink material 301 and the heat source material 302 that have a comparatively small Debye temperature difference (i.e. have only a small difference in their characteristic maximum phonon vibrational frequencies 311 and 312 respectively) and a correspondingly comparatively large phonon spectral match 321. Therefore, within FIG. 3b heat transfer between the heat sink material 301 and the heat source material 302 is facilitated since phonon transmission in turn is much higher, in turn since the heat sink material 301 and the heat source material 302 share many identical phonon vibrational frequency normal modes.

Figure 4A:
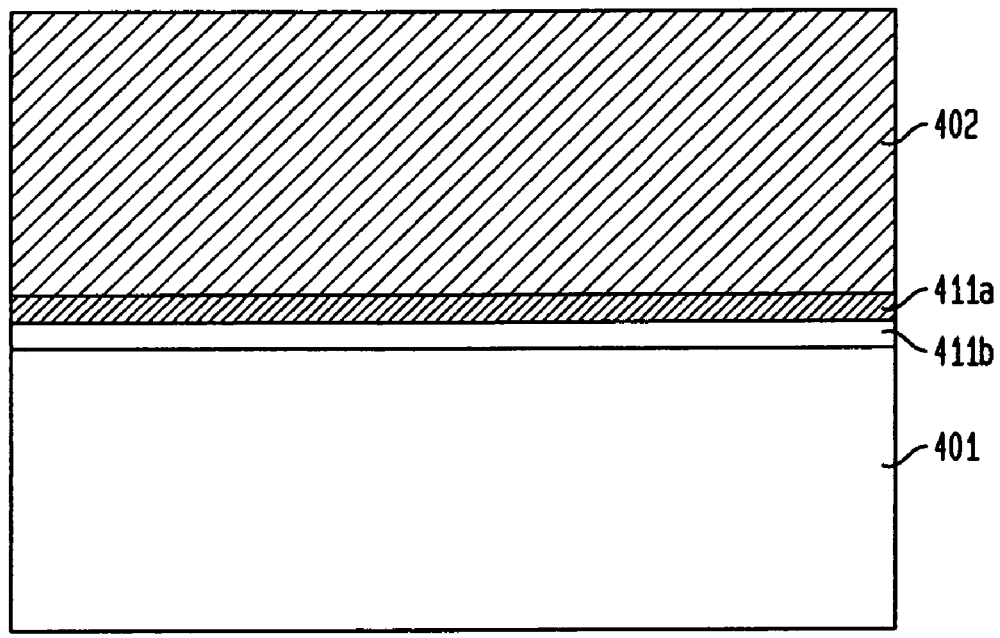
FIG. 4a and FIG. 4b illustrate a pair of inventive engineered heat transfer control structures comprising: (a) a heat transfer control structure designed to enhance heat transfer (i.e., phonon transmission) between a heat source material and a heat sink material (FIG. 4a); and (b) a heat transfer control structure designed to retard heat transfer (i.e., phonon transmission) between a heat source material and a heat sink material (FIG. 4b).
Figure 4B:
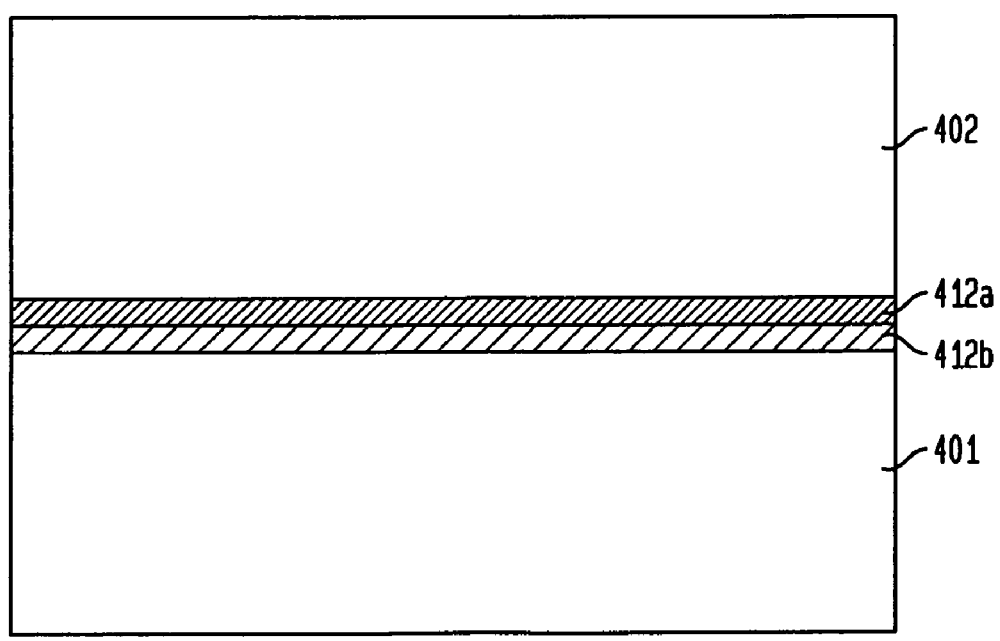

FIG. 4a and FIG. 4b show a pair of inventive engineered heat transfer control structures one each addressing the two cases where: (a) an enhanced heat transfer is desired between a heat source material and a heat sink material (i.e., FIG. 4a); and (b) a retarded heat transfer is desired between a heat source material and a heat sink material (i.e., FIG. 4b). The grayscale shades within FIG. 4a and FIG. 4b are intended to depict the difference in phonon spectra overlap between the various layers (i.e., white equates to strong overlap and black equates to minimal overlap). It is assumed that a thickness of all heat transfer control layers (but not necessarily thickness of a heat source material and a heat sink material) is of an appropriate dimension such that a thermal boundary resistance dominates over a bulk thermal resistance. FIG. 4a illustrates a pair heat transfer control layers 411a and 411b engineered to enhance phonon transmission (and heat transfer) between a heat source material 401 and a heat sink material 402. The gradual gradient from light gray to dark gray is intended to correspond with a gradual change in the interface phonon spectra through the addition of the two intervening heat transfer control layers 411a and 411b. Though two heat transfer control layers 411a and 411b are included it should be understood that the heat transfer control structure of FIG. 4a could consist of n (where n>=1) heat transfer control layers 411a-n interposed between the heat source material 401 and the heat sink material 402.

FIG. 4b illustrates a pair of heat transfer control layers 412a and 412b engineered to retard phonon transmission (and heat transfer) between the heat source material 401 and the heat sink material 402. In FIG. 4b, an abrupt change in phonon spectra across interfaces is deliberately effected through the addition of the pair of heat transfer control layers 412a and 412b as indicated through the grey scale mismatch. Again, it should be understood that the pair of retarding heat transfer control layers 412a and 412b illustrated in FIG. 4b could consist of n layers (where n>=1).

Figure 5:
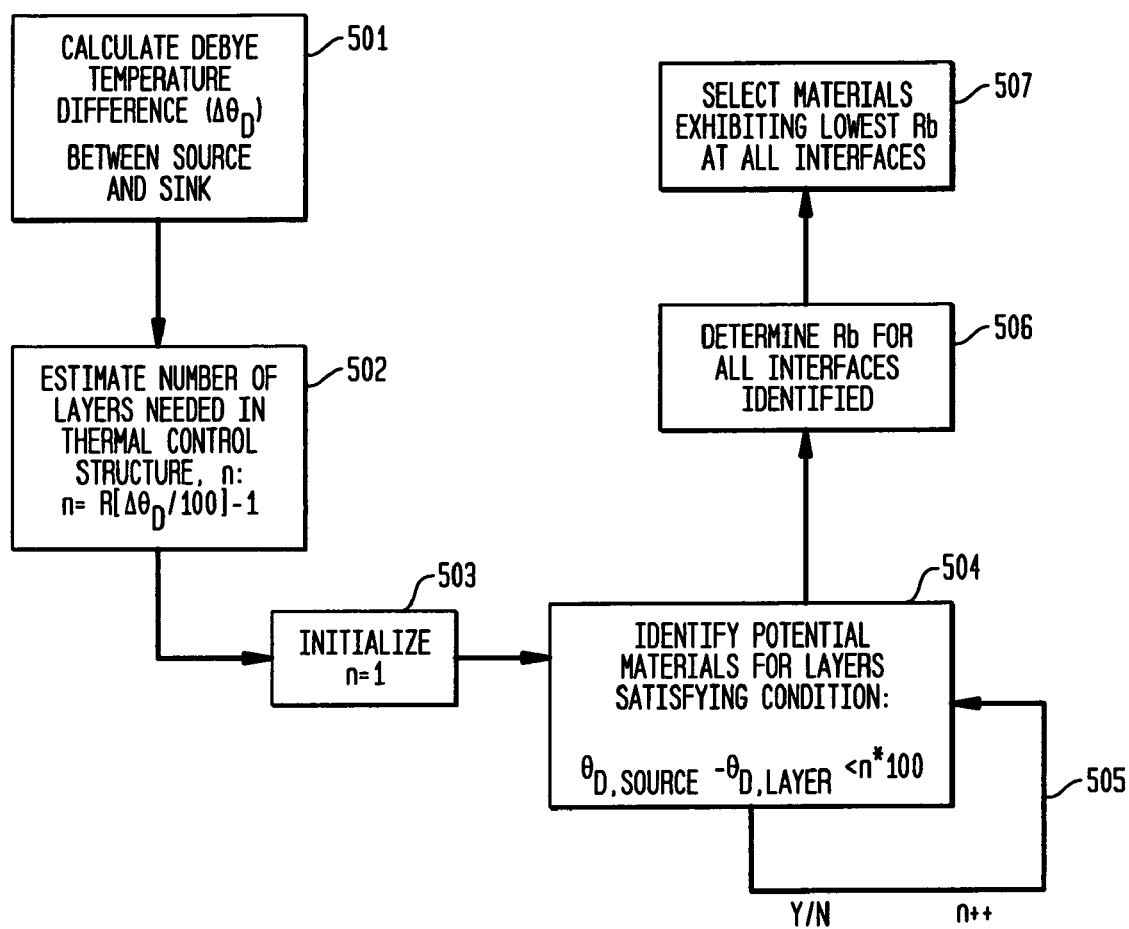
FIG. 5 shows a flow chart illustrating a series of process steps that may be used for designing a heat transfer control structure in accordance with the invention.

FIG. 5 shows a flowchart that may be used to identify and optimize a choice of materials for a heat transfer control structure using a Debye temperature mismatch as an indicator of phonon spectral mismatch. More particularly, the flowchart may be used for selecting at least one heat transfer control layer to be interposed between a heat source material and a heat sink material used for fabricating the heat transfer control structure. From a practical perspective, the selection of a particular material for a heat transfer control layer may be restricted due to several factors, including but not limited to cost, availability, compatibility, and capability of forming a defect free interface within a heat transfer control structure. Therefore, the flowchart in FIG. 5 serves as a guide for identifying plausible materials combinations that may in certain circumstances (i.e., given extraneous considerations) not necessarily be readily implementable.

Within FIG. 5, initial step 501 provides for calculation of a Debye temperature difference between a heat source material and a heat sink material between which phonon based heat transfer is desired to be controlled to a level not intrinsically accessible between the heat source material and the heat sink material alone. Once a determination of Debye temperature difference is completed in step 501, step 502 provides for determination of a number of phonon based heat transfer control layers needed in a heat transfer control structure in accordance with the invention. The determination undertaken in step 502 may be effected using an arbitrary criterion. As an example that is illustrated with particularity in step 502, the arbitrary criterion might require no more than a 100 K difference in the Debye temperatures of interfacing materials within a heat transfer control structure that comprises the heat source material, the heat sink material and at least one heat transfer control layer interposed therebetween. Thus, under certain circumstances, no heat transfer control layers may be needed interposed between a heat source material and a heat sink material having a Debye temperature difference of less than 100 K.

After initialization of a counter to n=1 in step 503, step 504 provides for identification of at least one material that satisfies the Debye temperature difference condition and Debye temperature range described above. Iterative loop 505 provides for iteratively modifying the Debye temperature condition after initializing the number of layers to n=1 in step 503. If a suitable material is not identifiable for one of the Debye temperature range conditions, then that material layer may be skipped and the materials for the next layer identified. It is advisable that multiple potential materials be selected for all Debye temperature range conditions.

Step 506 provides for determining (i.e., either calculating (using theoretical resources and modeling) or alternatively experimentally measuring) the thermal boundary resistances for all the potential material pair interfaces identified in step 504. A final step 507 provides for selecting materials pairs exhibiting lowest thermal boundary resistances at all interfaces. Thus, final step 507 provides selecting at least one heat transfer control layer predicated upon optimally meeting the thermal boundary resistance (i.e., heat transfer) condition not otherwise intrinsically achievable between the heat source material and the heat sink material alone.

Figures 6, 7:
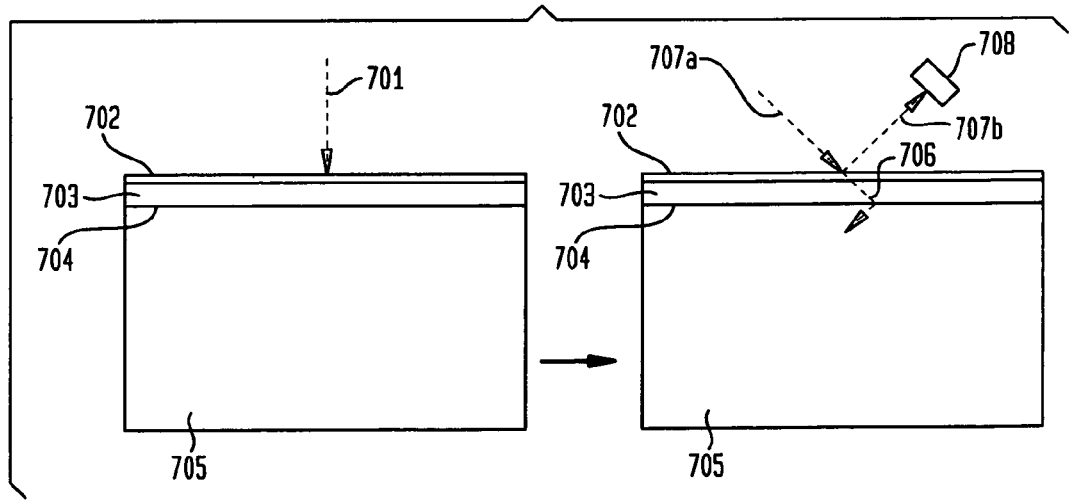
FIG. 6 shows a table illustrating a preferred coating that can be used to enhance thermal transfer (i.e., phonon transmission) between silicon and gold.
FIG. 7 shows a schematic diagram of a transient thermo reflection (TTR) apparatus that may be used to experimentally determine or verify a thermal boundary resistance between interfacing materials in accordance with the invention.

FIG. 6 shows a table derived from sample calculations that illustrate the benefits associated with interfacing two poorly matched materials (in terms of their phonon spectra), silicon and gold, using a thermal phonon based heat transfer control structure. Through the use of the series of laminated heat transfer control layers (i.e., titanium/copper/hafnium) within the heat transfer control structure to provide multiple heat transfer control layer interfaces of lower thermal boundary resistance, an almost 75% decrease (i.e., from 2.2 e-8 m2-K/W to 5.6 e-9 m2-K/W) in the overall stack thermal boundary resistance is obtained compared to the direct interfacing of silicon with gold (i.e. as a heat source material and heat sink material pair). Contrastingly, phonon propagation between, for example, silicon and copper may potentially be decreased by introducing alternating layers of gold and titanium (for adhesion purposes) between the silicon and copper (values not in table).

FIG. 7 shows a simplified diagram of a transient thermoreflectance apparatus (see, e.g. Stevens, IMECE '03. above) that may be used to experimentally determine or verify thermal boundary resistances in accordance with the invention. In the transient thermoreflectance method, an ultrashort laser beam pulse termed the pump beam 701 is directed at a sample of interest. The sample comprises: (1) a surface metal film 702 for localized heating; (2) a sample film 703 located immediately thereunder, where the sample film 703 may comprise a metal, semiconductor, or a dielectric; and (3) a substrate 705, where the substrate 705 may comprise a metal, semiconductor, or dielectric. An interface of interest 704 for which a thermal boundary resistance is determined is located between the sample film 703 and the substrate 705. The photons in the pump beam 701 are absorbed in the metal film 702 resulting in localized heating of the film. This heat 706 propagates through the sample film 703 to the substrate 704. The heat 706 flow effects a change in the temperature of the metal film 702 with an accompanying change in its reflectivity. This change in reflectivity is detected by a lower power laser pulse termed the probe beam. The probe beam has an incident component 707a and a reflected component 707b. Intensity of the reflected component 707b is detected using a photodetector 708.

For small changes in temperature, the reflectivity of metals in general varies linearly with temperature. Temperature changes of the surface metal film can be used to determine the heat flow through the system. Using one-dimensional heat conduction analysis; this heat flow can be used to calculate the corresponding temperature profile through each layer subject to two known boundary conditions (typically surface conditions, i.e. the top surface of the film and the bottom surface of the substrate can be assumed to be at known temperatures) and one known initial condition. The heat diffusion through each layer can be expressed as:

$$\rho_i C_{p,i} \left( \frac{\partial T_i}{\partial t} \right) = \frac{\partial}{\partial z} \left( K \frac{\partial T_i}{\partial z} \right) + Q_i(z, t)$$

where $\rho_i$ is the density of layer i (702, 703, or 705), $C_{p,i}$ is its specific heat, $T_i$ is its temperature, and $Q_i$ is the heat generated within the layer, which is 0 for all other layers but the surface layer (702 in FIG. 7). Within the foregoing equation, z is a direction orthogonal to the layer 703 and t is time.

The thermal boundary resistance at interface 704 can then be obtained from the boundary condition:

$$-K_{703} \frac{\partial T_{703}}{\partial z} = R_{704}(T_{703} - T_{705})$$

where $K_{703}$ is the thermal conductivity of layer 703, $T_n$ is the temperature of layer n, and $R_{704}$ is the boundary resistance at interface 704.

With respect to the above described apparatus, when the measurement of a metal-dielectric or metal-semiconductor thermal boundary resistance is of interest, no additional absorption layer 702 is needed if the sample 703 is a metal and the substrate 705 is a dielectric or semiconductor. For such a metal-dielectric or metal-semiconductor configuration, thermal boundary resistance can be more easily determined if several criteria are met. The criteria are: (i) the metal film 703 is of thickness larger than the optical penetration depth within the metal film 703, and the substrate 705 has a low optical absorption coefficient such that initial heating of the substrate 705 can be accurately assumed as negligible; (ii) the time constant for heat diffusion through the metal film 703 is significantly smaller than the time constant associated with heat diffusion through the interface 704; and (iii) the substrate 705 has a significant thermal conductivity.

Beyond the experimental transient thermoreflectance apparatus and calculations disclosed above, thermal boundary resistances may also be determined using other experimental techniques, of which a 3ω technique is an example (see, e.g.: (1) Cahill, "Thermal conductivity measurement from 30 to 750 K: the 3ω method," Rev. Sci. Instrum., Vol. 61(2), February 1990, pp. 802-08; and (2) Jagannadham et al., "Thermal resistance of interfaces in AlN-diamond thin film composites," J. App. Phys., Vol. 91(3), 1 Feb. 2002, pp. 1224-35).

The preferred embodiments and examples of the invention are illustrative of the invention rather than limiting of the invention. Revisions and modifications may be made to methods, materials, structures and dimensions of a heat transfer control structure in accordance with the preferred embodiments and examples of the invention, while still providing a heat transfer control structure in accordance with the invention, further in accordance with the accompanying claims.

What is claimed is:

1. A method for fabricating a heat transfer control structure comprising:
    providing a semiconductor heat source material having a first Debye temperature;
    forming a heat transfer control nanoscale film comprising a heat transfer control material having a second Debye temperature in direct contact with the semiconductor heat source material, wherein the difference between the first Debye temperature and the second Debye temperature is no greater than 100° K; and
    forming a metal heat sink material in direct contact with the heat transfer nanoscale film, the metal heat sink material has a third Debye temperature, wherein the difference between the second Debye temperature and the third Debye temperature is no greater than 100° K, wherein the heat transfer nanoscale film provides an enhanced heat transfer between the semiconductor heat source material and the metal heat sink material in comparison with the absence of the at least one heat transfer control layer, wherein the enhanced heat transfer results from the difference between the first Debye temperature and the second Debye temperature, and the difference between the second Debye temperature and the third Debye temperature.

2. A method for fabricating a heat transfer control structure comprising:
    forming at least one nanoscale heat transfer control layer comprising at least one heat transfer control material upon a semiconductor heat source material; and
    forming a metal heat sink material upon the nanoscale heat transfer control layer, wherein the at least one heat transfer control material is selected predicated upon a degree of thermal phonon spectra match between the semiconductor heat source material, the at least one heat transfer control material and the metal heat sink material, as evidenced by a continuing progression of Debye temperature for the semiconductor heat source material, the at least one heat transfer control material and the metal heat sink material, wherein a difference in Debye temperature between interfacing materials is no greater than 100° K, to provide an enhanced heat transfer between the semiconductor heat source material and the metal heat sink material in the presence of the at least one nanoscale heat transfer control layer in comparison with the absence of the at least one nanoscale heat transfer control layer.

3. The method of claim 2, wherein the semiconductor heat source material and the metal heat sink material are nanoscale films.

4. The method of claim 2, wherein the semiconductor heat source material comprises silicon.

5. The method of claim 2, wherein the at least one heat transfer control layer comprises at least one of titanium, copper, hafnium or a combination thereof.

6. The method of claim 2, wherein the metal heat sink material comprises copper or gold.

\* \* \* \* \*